(12) United States Patent
Fu et al.

(10) Patent No.: US 7,667,490 B2
(45) Date of Patent: Feb. 23, 2010

(54) VOLTAGE SHIFTER CIRCUIT

(75) Inventors: Zhigang Fu, Shanghai (CN); Ching Long Lin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/117,476

(22) Filed: May 8, 2008

(65) Prior Publication Data

US 2008/0290901 A1 Nov. 27, 2008

(30) Foreign Application Priority Data

May 23, 2007 (CN) .......................... 2007 1 0041094

(51) Int. Cl.
*H03K 19/0175* (2006.01)
(52) U.S. Cl. .......................................... 326/81; 326/68
(58) Field of Classification Search ............. 326/80–81, 326/68; 327/333
See application file for complete search history.

(56) References Cited

U.S. PATENT DOCUMENTS

| | | | | |
|---|---|---|---|---|
| 6,097,216 A | * | 8/2000 | Youn | ............................ 326/71 |
| 6,768,367 B1 | * | 7/2004 | Meadows et al. | ............ 327/333 |
| 2006/0061386 A1 | * | 3/2006 | Kanzaki | ........................ 326/81 |

* cited by examiner

*Primary Examiner*—James Cho
(74) *Attorney, Agent, or Firm*—Squire, Sanders & Dempsey, L.L.P.

(57) ABSTRACT

The present invention provides a voltage shifter circuit, in which a control circuit is used to control the pull-up circuit, so that the pull-up circuit is kept as off when the signal from the input signal source changes from a low voltage to a high voltage. Hence, the competition between the pull-up circuit and the pull-down circuit is avoided. The speed of the voltage shifter circuit is improved and the voltage shifter circuit can operate within a wider voltage range. The delay time of the pull-up circuit and the pull-down circuit is small and the duty cycle is small. In addition, since no direct current path is established, no current is wasted. Additionally, the voltage shifter circuit uses the second delayer to compensate the delay time between the pull-up circuit and the pull-down circuit and optimizes the duty cycle.

12 Claims, 5 Drawing Sheets

VOLTAGE SHIFTER CIRCUIT

The present application claims the benefit of Chinese Application No. 200710041094.7 filed on May 23, 2007, titled "VOLTAGE SHIFTER CIRCUIT", which is incorporated herein by reference in its entirety.

FIELD OF THE INVENTION

The present invention relates to a voltage shifter circuit.

BACKGROUND OF THE INVENTION

In modern Integrated Circuit (IC) system, the core logic unit is designed to operate with 1.0V (with the 65 nm technology) to obtain a high speed, while the Input/Output (I/O) unit is designed to operate with 3.3V, 2.5V or 1.8V to realize the stabilization. Due to the different operation voltages, a converting circuit is configured between the core logic unit and the I/O unit, so that the voltage of 1.0V can be converted into the voltage of 3.3V. The above converting circuit is also referred as a voltage shifter circuit.

FIG. 1 shows a voltage shifter circuit 10 in the prior art, including: PMOS transistors PG1 and PG2; NMOS transistors NG1 and NG2; and an inverter INV. The PMOS transistors PG1 and PG2 are referred as the pull-up transistors and the NMOS transistors NG1 and NG2 are referred as the pull-down transistors. A high voltage signal is input from an input signal source In as the operation voltage for the core circuit. Particularly, a modulated pulse signal of rectangle wave, ranging from 1.0V to 1.2V, is input from the signal source In. An operation voltage ranging from 2.5V to 3.3V is input from the first voltage source VD for the I/O circuit region.

For example, the signal from the signal source In is at the high voltage of 1.2V and the voltage from the first voltage source VD is at 3.3V When the input signal is at the low voltage of 0V, the NMOS transistors NG1 is turned on and the voltage at ND1 is pulled down to low voltage, and the PMOS transistors PG2 is turned on and the voltage at ND2 is pulled up to high voltage of 3.3V When the input signal changes from the low voltage of 0V to the high voltage of 1.2V, the NMOS transistors NG2 is turned on and the voltage at ND2 is pulled down to low voltage of 0V, and the PMOS transistor PG1 is turned on also. Hence, a competition is generated between the NMOS transistor NG1 and the PMOS transistor PG1. Since the voltage from the first voltage source is 3.3V and the voltage for the NMOS transistors NG1 is 1.2V, with the same area, the current-driven capacity of the NMOS transistors NG1 is less than that of the PMOS transistors PG1. Hence, in order to improve the current-driven capacity of the NMOS transistors NG1 and the capacity for pulling down the voltage of ND1, the size of the NMOS transistors NG1 is increased. However, the parasitic capacitance is increased and the voltage shifting speed is lowed. Since the voltage for the core circuit is 1.0V and the voltage for the I/O circuit is 3.3V in the 90 nm technology, a lager area is required due to the larger voltage difference and hence the voltage shifting speed is further affected. In addition, the duty cycle of the output voltage is difficult to be optimized due the competition between the pull-up circuit and the pull-down circuit.

To solve the above problems, a voltage shifter circuit is disclosed in the prior art, as show in FIG. 2. The voltage shifter circuit includes: a pull-up circuit 100, adapted to pull up the voltage at node A or B to a first voltage V2; a pull-down circuit 200, adapted to pull down the voltage at node A or B to the ground voltage i.e. zero voltage; and at least one assistant pull-up device or switching device, adapted to pull up or pull down the voltage at node A or B. The voltage shifter circuit further includes: an inverter 110, adapted to invert the input signal; and an inverter 120, adapted to invert the input signal at node C and output an inverted signal to node D; and an inverter 130, adapted to invert the signal at node B and output an inverted signal to the output terminal of the voltage shifter circuit.

The pull-up circuit 100 includes PMOS transistors P1 and P2, adapted to pull up the voltages at node A and B respectively. The pull-down circuit 200 includes NMOS transistors N1 and N2, adapted to pull down the voltage at node B. The assistant pull-up device or switching device includes: an NOMS transistor N3 coupled between the source and drain of the PMOS transistor P2. The assistant pull-up device or switching device is added for pulling up the voltage at node A or B to the first voltage V2 quickly. The above voltage shifter circuit may improve the speed for shifting the voltage and may alleviate the problem that the NMOS transistors N1 and N2 are large. However, the problems can not be solved completely. For example, the input signal Input is a rectangle wave and ranges from 0 to 1.0V, and the output signal Output at the output terminal is a rectangle wave and ranges from 0 to 3.3V Because the NMOS transistor N3 and N4 are required to be fabricated as the thick oxide transistor (the drain is connected with 3.3V), the threshold voltage is large (about 0.65V) and the effective voltage (=Vgs−Vth=1.0V−0.65V=0.35V) is small when a voltage ranging from 0 to 1.0V is used to control the NMOS transistors N3 and N4. However, when the size of the NMOS transistor N3 and N4 are increased, the parasitic capacitance is also increased. Especially when the difference between the voltage for the core circuit region and the voltage for the I/O circuit region is large, the speed is further affected. In addition, since the competition between the pull-up circuit 100 and the pull-down circuit 200 still exists, the device is sensitive to the process and the duty cycle is difficult to be controlled. Moreover, a direct current path exists from the first voltage source V2 (about 3.3V) to the ground terminal during the voltage shifting, and the power efficiency is lowed.

U.S. Pat. No. 7,145,363 discloses the information related to the above solution.

SUMMARY OF THE INVENTION

An object of the present invention is to provide a voltage shifter circuit with a wide operation voltage range and a high speed.

The present invention provides a voltage shifter circuit, including: a pull-up circuit, connected to a first voltage source; a pull-down circuit, connected between the pull-up circuit and a ground terminal and connected to an input signal source, adapted to make the voltage shifter circuit output a modulated pulse signal having a high voltage of a first voltage and a low voltage of zero with an operation together with the pull-down circuit; a node, at which the pull-up circuit and the pull-down circuit are connected; wherein, further including: a control circuit, including: a second inverter, one input terminal of which is connected to the node and the other input terminal is connected to the first voltage source, adapted to invert a node voltage and output an inverted node voltage as an output signal of the voltage shifter circuit; a first delayer, connected to the second inverter, adapted to delay the inverted node voltage; a control sub-circuit in the pull-up circuit, a first input terminal of which is connected to the first delayer, a second input terminal of which is connected to the first voltage source, a third input terminal of which is connected to the inverted signal and an output terminal of which is connected to the pull-up circuit, adapted to turn off the pull-up circuit when the input signal changes to a high voltage from a low voltage.

Optionally, the voltage shifter circuit further includes: a first PMOS transistor, a source of which is connected to the first voltage source, a drain of which is connected to the pull-up circuit and a gate of which is connected to the node, adapted to keep the voltage at the output terminal of the control sub-circuit in the pull-up circuit; and a second PMOS transistor, a source of which is connected to the first voltage source, a drain of which is connected to the node and a gate of which is connected to the output terminal of the voltage shifter circuit, adapted to keep the voltage at the node.

Optionally, the control sub-circuit in the pull-up circuit further includes: a first NMOS transistor, a source of which is connected to the ground terminal and a gate of which is connected to the input signal source via a first inverter; a second NMOS transistor, a source of which is connected to the drain of the first NMOS transistor and a gate of which is connected to the input signal source via a first inverter; a third NMOS transistor, a source of which is connected to the drain of the second NMOS transistor and a gate of which is connected to the first delayer, bulk electrodes of the first, second and third NMOS transistors being connected to the ground terminal; a third PMOS transistor, a drain of which is connected to the drain of the third NMOS transistor and is lead out as the output terminal of the control sub-circuit in the pull-up circuit, a source of which is connected to the first voltage source, and a gate of which is connected to the first delayer.

Optionally, a threshold voltage of the second NMOS transistor of the control sub-circuit in the pull-up circuit is less than zero Optionally, the pull-down circuit is connected to the input signal source through the third inverter, the second delayer and the first inverter; the first inverter is adapted to invert the voltage of the signal from the input signal source; the second delayer is adapted to delay the inverted signal; and the third inverter is adapted to invert the voltage of the delayed and inverted signal.

Optionally, the pull-down circuit includes: a first pull-down NMOS transistor, a source of which is grounded and a gate of which is connected to the input signal source through the third inverter, the second delayer and the first inverter in sequence; a second pull-down NMOS transistor, a source of which is connected to the drain of the first pull-down NMOS transistor, a drain of which is connected to the node and a gate of which is connected to the input signal source through the third inverter, the second delayer and the first inverter in sequence, bulk electrodes of the first pull-down NMOS transistor and the second pull-down NMOS transistor being connected to the ground terminal.

Optionally, the threshold voltage of the second pull-down NMOS transistor is less than zero.

Optionally, the pull-up circuit includes: a first pull-up PMOS transistor, a drain of which is connected to the node, a bulk electrode of which is connected to the first voltage source, and a gate of which is connected to the input signal source through the third inverter, the second delayer and the first inverter in sequence; and a second pull-up PMOS transistor, a drain of which is connected to the source of the first pull-up PMOS transistor, a source of which is connected to the first voltage source, a bulk electrode of which is connected to the source and a gate of which is connected to an output terminal of the control sub-circuit in the pull-up circuit.

Optionally, the delay time of the first delayer is less than 200 ps.

Optionally, the delay time of the second delayer is less than 200 ps.

Optionally, the first voltage is the operation voltage for the I/O circuit region.

Optionally, the high voltage of the signal from the input signal source is the operation voltage for the core circuit region.

Compared with the prior art, the present invention has the following advantages. The competition between the pull-up circuit and the pull-down circuit is avoided since the control circuit is used to control the pull-up circuit. Therefore, the speed of the voltage shifter circuit is improved and the voltage shifter circuit can operate within a wider voltage range (i.e. the large difference between the first voltage and the high voltage of the signal from the input signal source is allowed). The delay time of the pull-up circuit and the pull-down circuit is small and the duty cycle is small. Hence, the present invention may be applied to the circuit of 90 nm-below technology with a high speed and a small delay. In addition, since no direct current path is established, no current is wasted.

Additionally, the above solution further optimizes the duty cycle by using the second delayer to avoid the delay time between the pull-up circuit and the pull-down circuit.

BRIEF DESCRIPTIONS OF THE DRAWINGS

DETAILED DESCRIPTIONS OF THE EMBODIMENTS

The present invention provides a voltage shifter circuit in which a control circuit is used to control a pull-up circuit, so that the pull-up circuit is turned off when an input signal changes from a low voltage to a high voltage. Therefore, the competition between the pull-up circuit and the pull-down circuit will not be caused.

First of all, one embodiment of the present invention provides a voltage shifter circuit, including: a pull-up circuit, connected to a first voltage source; a pull-down circuit, located between the pull-up circuit and a ground terminal and connected to an input signal source, adapted to make the voltage shifter circuit output a modulated pulse signal having a high voltage of the first voltage and a low voltage of zero with an operation together with the pull-down circuit; a node, at which the pull-up circuit and the pull-down circuit are connected; and the voltage shifter circuit further includes a control circuit, including: a second inverter, one terminal of which is connected to the node and the other terminal is connected to the first voltage source, adapted to invert a node voltage and output an inverted node voltage as an output signal of the voltage shifter circuit; a first delayer, connected to the second inverter, adapted to delay the inverted node voltage; a control sub-circuit in the pull-up circuit, a first input terminal of which is connected to the first delayer, a second input terminal of which is connected to the first voltage source, a third input terminal of which is connected to the inverted signal and an output terminal is connected to the pull-up circuit, adapted to turn off the pull-up circuit when the input signal changes to a high voltage from a low voltage.

Figure 1:
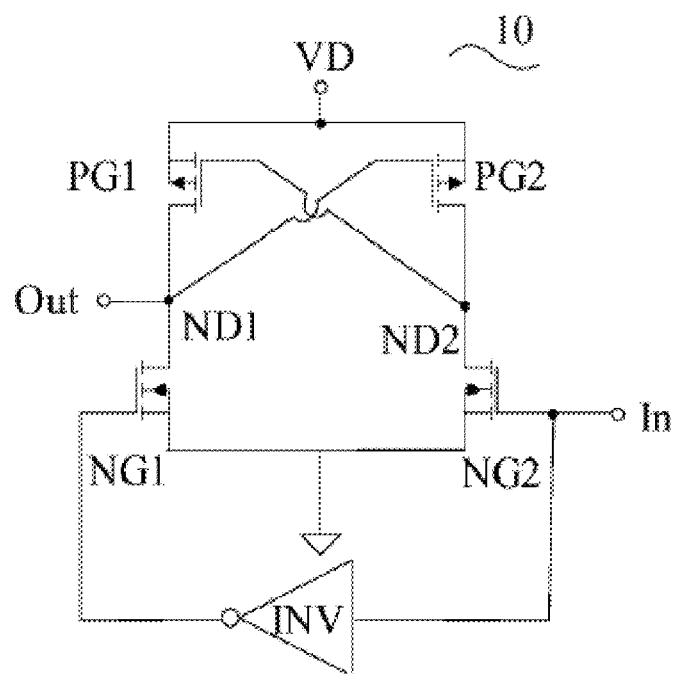
FIGS. 1 and 2 show the voltage shifter circuit in the prior art.
Figure 2:
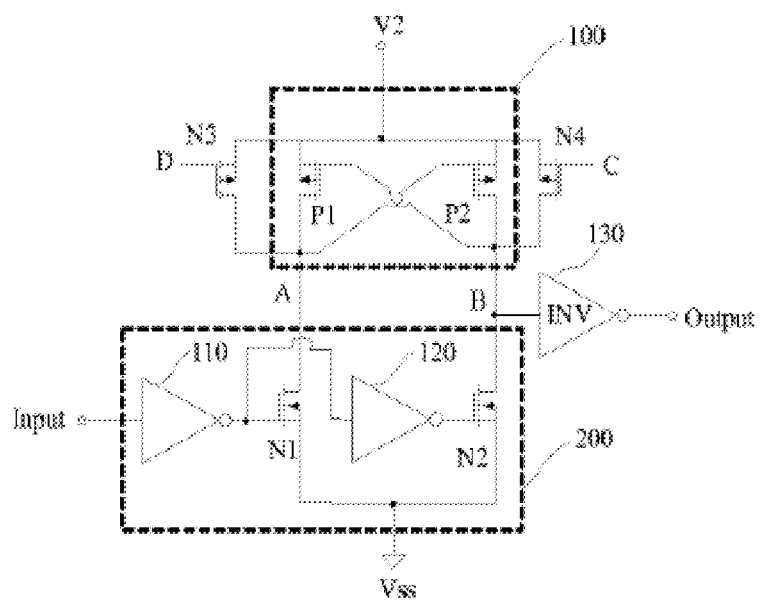
Figure 3:
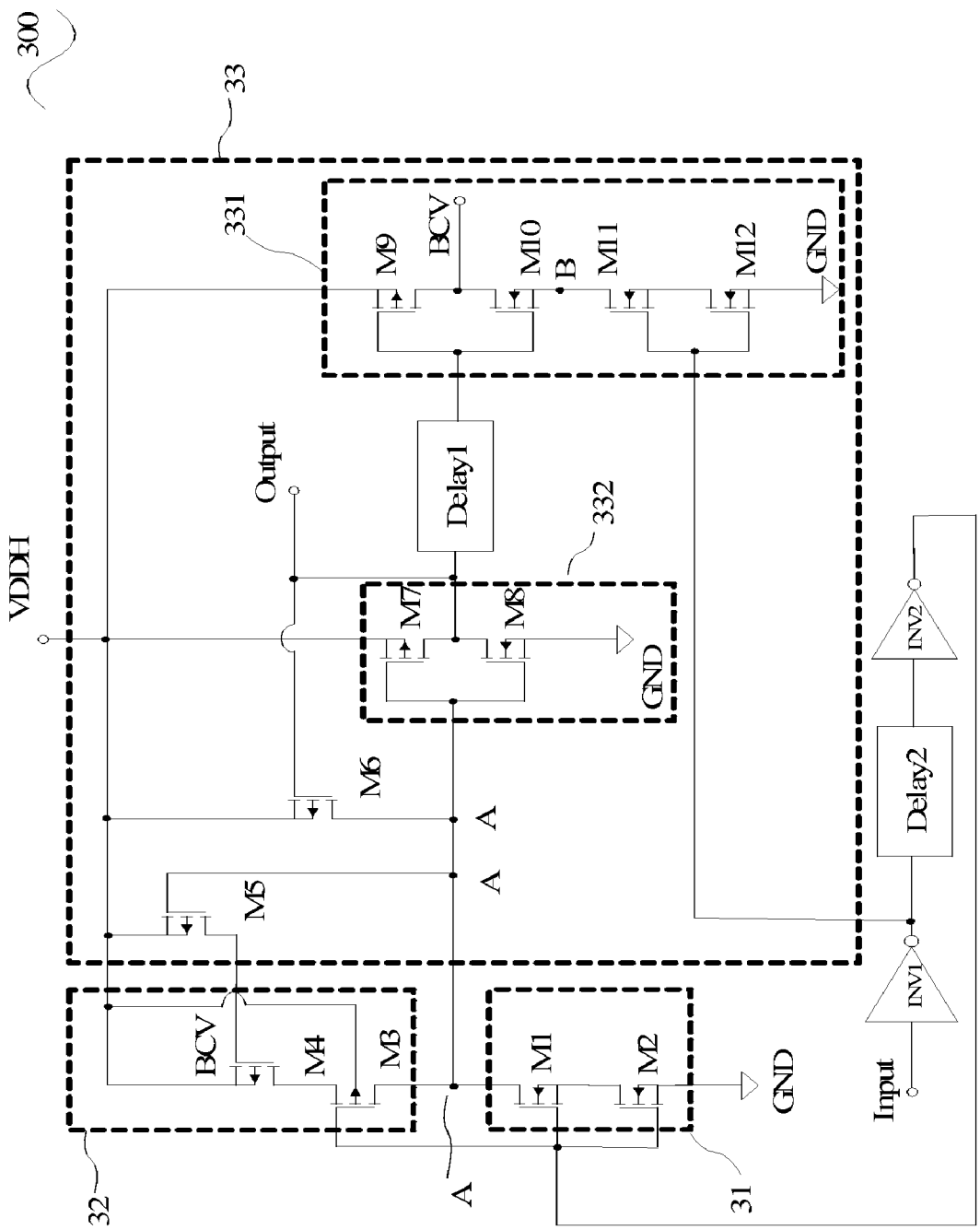
FIG. 3 shows a voltage shifter circuit according to an embodiment of the present application.

Hereinafter, descriptions will be given with respect to the drawings. Referring to FIG. 3, a voltage shifter circuit 300 according to one embodiment of the present invention is provided, including:

a pull-up circuit 32, connected to a first voltage source VDDH which outputs an operation voltage for an I/O circuit region; and a pull-down circuit 31, connected between the pull-up circuit 32 and the ground terminal GND, adapted to make the voltage shifter circuit 300 output a modulated pulse signal having a high voltage of the first voltage and a low voltage of zero with an operation together with the pull-up circuit 32.

The pull-down circuit 31 connects to the input signal source Input through the third inverter INV2, the second delayer Dealy2 and the first inverter INV1. The signal from the input signal source Input is a modulated pulse signal. The high voltage of the modulated pulse signal is used as the operation voltage of the core circuit region, and the low voltage of the modulated pulse signal is zero. The delay time of the second delayer Dealy2 is less than 200 ps. The first inverter INV1 is adapted to invert the voltage of the signal from the input signal source Input. The second delayer Dealy2 is adapted to delay the inverted signal. The third inverter INV3 is adapted to invert the voltage of delayed and inverted signal from the input signal source Input.

The Node A is provided at the connection of the pull-up circuit 32 and the pull-down circuit 31.

One input terminal of the control circuit 33 is connected to the first voltage source VDDH, and the other input terminal is connected to the input signal source Input. The control terminal of the control circuit 33 is connected to the Node A and the pull-up circuit 32 to control the pull-up circuit 32.

The control circuit 33 of the voltage shifter circuit 300 further includes:

a second inverter, one input terminal of which is connected to the node A and the other input terminal is connected to the first voltage source VDDH, adapted to invert a node voltage at node A and output an inverted voltage as an output of the voltage shifter circuit 300;

a first delayer Delay 1, connected to the second inverter 332, adapted to delay the inverted voltage at Node A, and the delay time of the first delayer Delay 1 being less than 200 ps;

a control sub-circuit 331 in the pull-up circuit, a first input terminal of which is connected to the first delayer Delay 1, a second input terminal of which is connected to the first voltage source VDDH, a third input terminal of which is connected to the output terminal of the inverter INV1, and an output terminal of which is connected to the pull-up circuit 32, adapted to turn off the pull-up circuit 32 when the input signal changes to high voltage 1 from low voltage 0.

The control circuit 33 further includes:

a first PMOS transistor M5, a source of which is connected to the first voltage source VDDH, a drain of which is connected to the pull-up circuit 32 and a gate of which is connected to the node A, adapted to keep the voltage at the output terminal of the control sub-circuit 331 in the pull-up circuit;

a second PMOS transistor M6, a source of which is connected to the first voltage source VDDH, a drain of which is connected to the node A and a gate of which is connected to the output terminal of the voltage shifter circuit 300, adapted to keep the voltage at node A.

The control sub-circuit 331 in the pull-up circuit 33 further includes:

a first NMOS transistor M12, a source of which is connected to the ground terminal GND and a gate of which is connected to the input signal source Input via the first inverter INV1;

a second NMOS transistor M11, adapted to perform an overvoltage protection for the first NMOS transistor M12, a source of which is connected to the drain of the first NMOS transistor M12 and a gate of which is connected to the input signal source Input via the first inverter INV1, and which is a native MOS transistor and has a threshold voltage less than zero;

a third NMOS transistor M10, a source of which is connected to the drain of the second NMOS transistor M11 and a gate of which is connected to the input signal source Input via the first inverter INV1, a bulk electrode of the third NMOS transistor M10, the second NMOS transistor M11 and the first NMOS transistor M12 being connected to the ground terminal GND;

a third PMOS transistor M9, a drain of which is connected to the drain of the third NMOS transistor M10, a source of which is connected to the first voltage source VDDH, and a gate of which is connected to the first delayer Delay1.

The pull-down circuit 31 includes:

a first pull-down NMOS transistor M2, a source of which is grounded and a gate of which is connected to the input signal source Input through the third inverter INV2, the second delayer Delay2 and the first inverter INV1 in sequence;

a second pull-down NMOS transistor M1, a source of which is connected to the drain of the first pull-down NMOS transistor M2, a drain of which is connected to the node A and a gate of which is connected to the input signal source Input through the third inverter INV3, the second delayer Delay2 and the first inverter INV1 in sequence, bulk electrodes of the first pull-down NMOS transistor M2 and the second pull-down NMOS transistor M1 being connected to the ground terminal GND.

The first pull-down NMOS transistor M2 locates in the core circuit region. In the 90 nm technology, the first pull-down NMOS transistor M2 has a threshold voltage of about 0.2V and has a thin gate dielectric layer with a weak voltage withstand capacity. The second pull-down NMOS transistor M1 is a native transistor, has a threshold voltage less than zero and has a thick gate dielectric layer with a strong voltage withstand capacity. The second pull-down NMOS transistor M1 is connected to the first pull-down NMOS transistor M2 in series so as to realize an overvoltage protection for the first pull-down NMOS transistor M2. In addition, since the threshold voltage of the second pull-down NMOS transistor M1 is less than zero and the current leakage tends to occur, the second pull-down NMOS transistor M1 is connected to the first pull-down NMOS transistor M2 in series to prevent the second pull-down NMOS transistor M1 from the current leakage.

The pull-up circuit 32 includes:

a first pull-up PMOS transistor M3, a drain of which is connected to node A, a bulk electrode of which is connected to the first voltage source VDDH, and a gate of which is connected to the input signal source Input through the third inverter INV2, the second delayer Delay2 and the first inverter INV1 in sequence; and a second pull-up PMOS transistor M4, a drain of which is connected to the source of the first pull-up PMOS transistor M3, a source of which is connected to the first voltage source VDDH, a bulk electrode of which is connected to the source and a gate of which is connected to an output terminal BCV lead out from the drain of the third NMOS transistor M10 and the drain of the third PMOS transistor M9.

According to the embodiment, each of the transistors in the pull-up circuit 32 is operated with the operation voltage of the I/O circuit region. Except for the first NMOS transistor M12, other devices in the control circuit 33 are operated with the operation voltage of the I/O circuit region. The first inverter INV1, the second delayer Delay2, the third inverter INV2 are all operated with the operation voltage of the I/O circuit region.

According to the embodiment, the second inverter 332 includes an NMOS transistor M8 and a PMOS transistor M7. As shown in FIG. 3, the source of the NMOS transistor M8 is grounded, the bulk electrode is connected to the source, the gate is connected to the gate of the PMOS transistor M7 and connected with the node A. The drain of the NMOS transistor M8 is connected to the drain of the PMOS transistor M7 and connected with the first delayer Delay1. The source of the PMOS transistor M7 is connected to the first voltage source VDDH.

The processing of the voltage shifter circuit 300 according to the embodiment of the present invention is as follows.

In this embodiment, it is assumed that the output of the VDDH is 3.3V, the input signal source Input outputs a modulated pulse signal with a high voltage of 1.0V The output signal at the output terminal is a modulated pulse signal with a high voltage of 3.3V.

When the voltage of the signal from the input signal source Input is zero, the signal is inverted by the first inverter INV1, and then input to the gates of the first NMOS transistor M12 and the first NMOS transistor M11. Hence, the first NMOS transistor M12 and the first NMOS transistor M11 are turned on, and the voltage at node B is pulled up to zero.

Moreover, through the first inverter INV1, the second delayer Delay2 and the third inverter INV2, the signal from the input signal source Input is input to the gates of the first pull-down NMOS transistor M2, the second pull-down NMOS transistor M1 and the first pull-up PMOS transistor M3. Hence, only the first pull-up PMOS transistor M3 is turned on and the voltage at node A is high (3.3V). The signal becomes the low voltage of 0 through the second inverter 332 and is output from the output terminal of the voltage shifter circuit 300. Then, the signal is delayed by the first delayer Delay1 and input to the gates of the third NMOS transistor M10 and the third PMOS transistor M9 of the control sub-circuit 331 in the pull-up circuit, so that the third PMOS transistor M9 is turned on and the voltage at the output terminal BCV of the control sub-circuit 331 in the pull-up circuit is pulled up to 3.3V and the second pull-up PMOS transistor M4 is turned off.

When the signal from the input signal source Input changes from the low voltage of 0V to the high voltage of 1 (1.0V), the signal is input to the gates of the first NMOS transistor M12 and the first NMOS transistor M11 of the control sub-circuit 331 in the pull-up circuit. Hence, the first NMOS transistor M12 and the first NMOS transistor M11 are turned off. When the signal from the input signal source Input changes from the low voltage of 0V to the high voltage of 1 (1.0V), the voltage at node B is kept at 0V.

Moreover, through the first inverter INV1, the second delayer Delay2 and the third inverter INV2, the signal from the input signal source Input is input to the gates of the first pull-down NMOS transistor M2, the second pull-down NMOS transistor M1 and the first pull-up PMOS transistor M3. Hence, the first pull-down NMOS transistor M2 and the second pull-down NMOS transistor M1 are turned on and the voltage at node A is low (0V). The signal becomes the high voltage of 1 (3.3V) through the second inverter 332 and is output from the output terminal of the voltage shifter circuit 300. Then, the signal is delayed by the first delayer Delay1 and input to the gates of the third NMOS transistor M10 and the third PMOS transistor M9 in the control sub-circuit 331 in the pull-up circuit, so that the third PMOS transistor M9 is turned on and the first NMOS transistor M11 is turned off. Therefore, the voltage at the output terminal BCV of the control sub-circuit 331 in the pull-up circuit is floating. Since the voltage at node A is the low voltage of 0, the first PMOS transistor M5 is turned on and the voltage at the gate of the second pull-up PMOS transistor M4 is pulled up, and the voltage at the output terminal BCV of the control sub-circuit 331 in the pull-up circuit is pulled up to 3.3V.

When the voltage at node A has not reached the high voltage 1(3.3V), the third NMOS transistor M10 and the third PMOS transistor M9 may be turned on simultaneously and hence a logic error is caused. In this embodiment, the first delayer Delay 1 is used to keep the voltage at the output terminal BCV of the control sub-circuit 331 in the pull-up circuit as the low voltage, and the logic error can be avoided.

When the signal from the input signal source Input is high 1(10V), the third PMOS transistor M9, the first NMOS transistor M12 and the first NMOS transistor M11 are turned off and only the third NMOS transistor M10 is turned on. The voltage at the output terminal BCV of the control sub-circuit 331 in the pull-up circuit is floating, and is kept as the high voltage (3.3V) by the first PMOS transistor M5. When the signal from the input signal source Input is low, the first pull-down NMOS transistor M2, the second pull-down NMOS transistor M1 and the second pull-up PMOS transistor M4 are turned off and the first pull-up PMOS transistor M3 is turned on. The voltage at node A is floating and the second PMOS transistor M6 is turned on, and the voltage at node A is kept as the high voltage of 3.3V.

When the signal from the input signal source Input changes from the high voltage 1(1.0V) to the low voltage 0, the signal is transmitted to the gates of the first NMOS transistor M12 and the first NMOS transistor M11 through the inverter INV1. Therefore, the first NMOS transistor M12 and the first NMOS transistor M11 are turned on and the voltage at node B is pulled down to the low voltage of 0. Since the third NMOS transistor M10 is turned on, the voltage at the output terminal BCV of the control sub-circuit 331 in the pull-up circuit is low (0).

Moreover, through the first inverter INV1, the second delayer Delay2 and the third inverter INV2, the signal from the input signal source Input is input to the gates of the first pull-down NMOS transistor M2, and the first pull-up PMOS transistor M3. Hence, the first pull-up PMOS transistor M3 is turned on and the voltage at node A becomes high (3.3V). The signal becomes the low voltage of 0 through the second inverter 332 and is output from the output terminal of the voltage shifter circuit 300. Then, the signal is delayed by the first delayer Delay1 and input to the gates of the third NMOS transistor M10 and the third PMOS transistor M9 in the control sub-circuit 331 in the pull-up circuit, so that the third PMOS transistor M9 is turned on. Therefore, the voltage at the output terminal BCV of the control sub-circuit 331 in the pull-up circuit is floating and the second pull-up PMOS transistor M4 is turned off. Since the voltage at node A is floating after the second pull-up PMOS transistor M4 is turned off, the inverter 331 and the second PMOS transistor M6 keep the voltage at node A as high voltage (3.3V).

Figure 4:
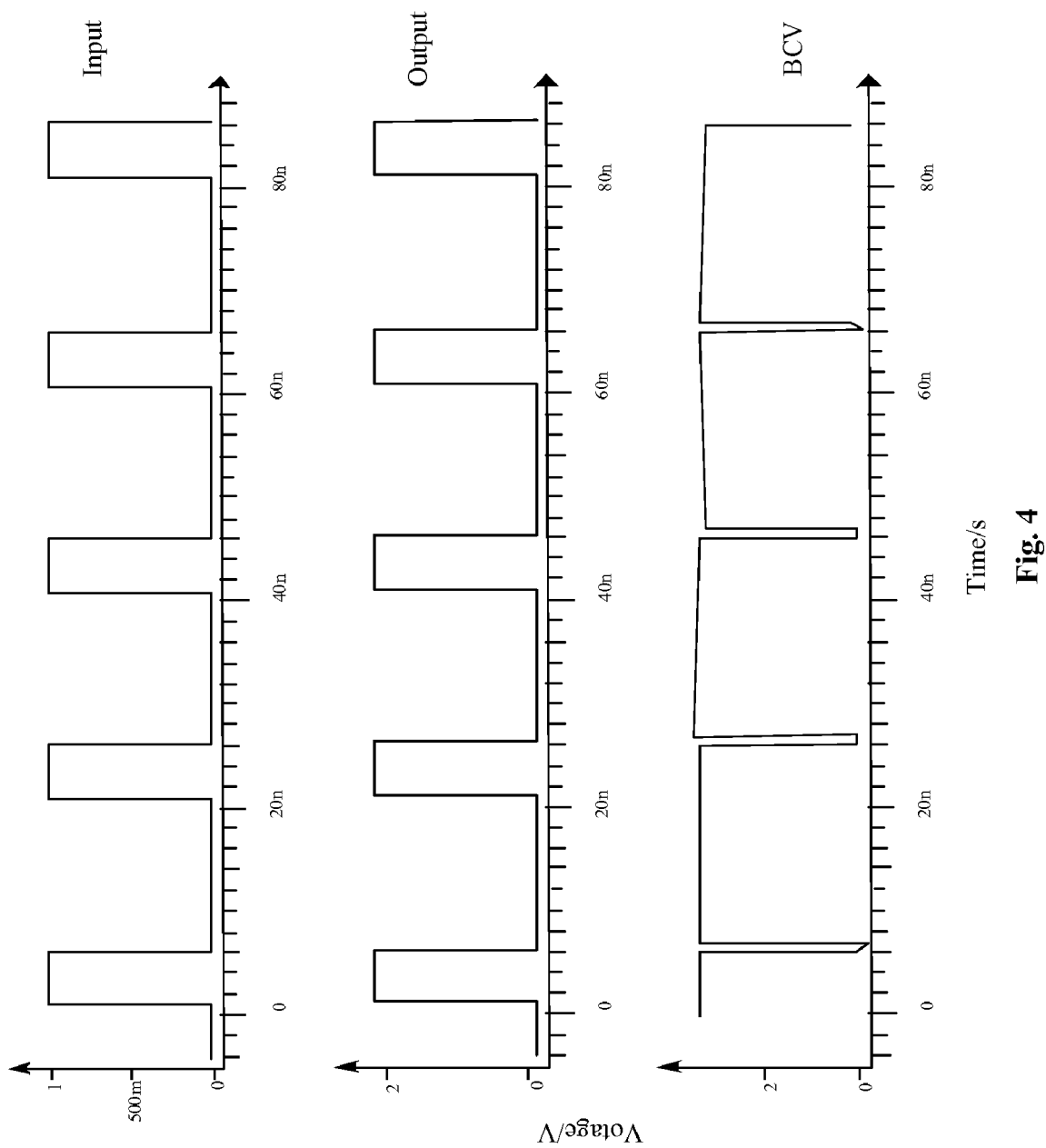
FIG. 4 shows the modulated pulse signal output from the input signal source, the output terminal of the voltage shifter circuit and the output terminal of the control sub-circuit in the pull-up circuit of FIG. 3.

FIG. 4 shows the modulated pulse signal output from the input signal source Input, the output terminal Output of the voltage shifter circuit and the output terminal BCV of the control sub-circuit 331 in the pull-up circuit of FIG. 3.

In this embodiment, the control circuit is used to control the pull-up circuit, so that when the input signal source Input changes from the high voltage 0 to the low voltage 1, the pull-up circuit 32 is kept off. Hence, the competition between the pull-up circuit 32 and the pull-down circuit 21 is avoided and the following advantageous can be obtained. The speed of the voltage shifter circuit is improved and the voltage shifter circuit can operate within a wider range of the operation voltage (i.e. the difference between the high voltage of the first voltage source and the high voltage of the input signal source is larger). The delay time of the pull-up circuit and the pull-down circuit is small. The variation of the input and output duty cycle is small and is suitable to the circuit with a small delay time and high speed in the 90 nm-below technology. Moreover, since no competition exists between the pull-up and the pull-down circuit, the direct current path will not be formed when the signal is inverted or kept and further the current will not be wasted.

In this embodiment, the second delayer is used to delay the inverted input signal. Therefore, the delay time is further adjusted and the duty cycle is optimized.

Figure 5:
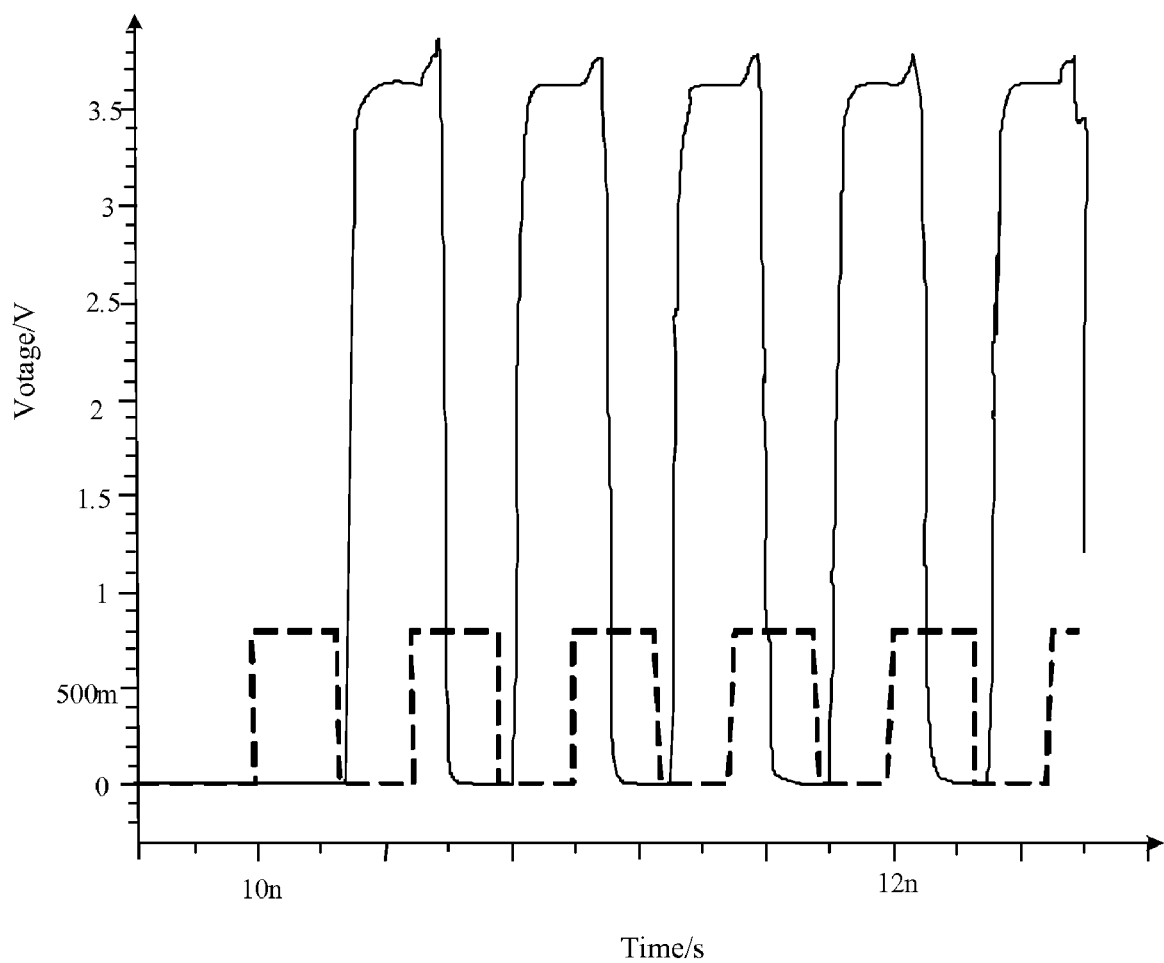
FIG. 5 shows a modulated pulse signal output from the voltage shifter circuit according to an embodiment of the present invention under a condition.

FIG. 5 shows a modulated pulse signal output from the voltage shifter circuit according to an embodiment of the present invention when a rectangle wave with a high voltage of 0.8V is input, the first voltage is 3.63V and the frequency is high (2 GHZ). In FIG. 5, the dash line shows the waveform of the input signal and the solid line shows the modulated pulse signal output from the output terminal of the voltage shifter circuit. The calculated duty cycle of the input signal is 52% and the duty cycle of the modulated pulse signal output from the voltage shifter circuit is 59%. The difference between the duty cycles is 7% and is small.

Figure 6:
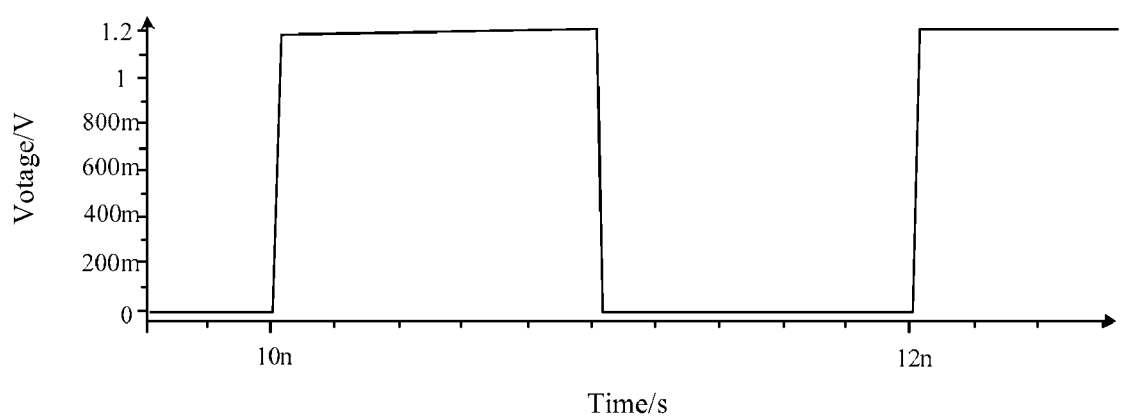
FIG. 6 shows a signal from the input signal source of the voltage shifter circuit according to an embodiment of the present invention.
Figure 7:
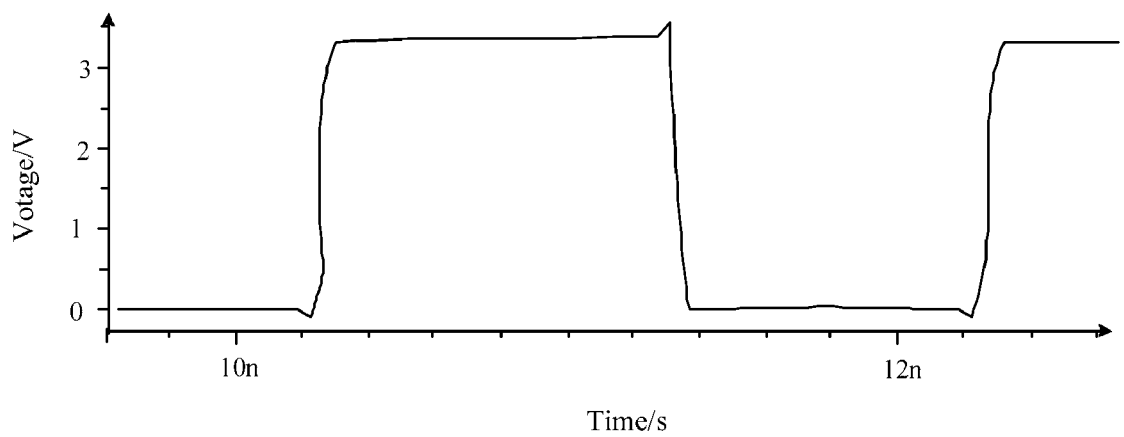
FIG. 7 shows a modulated pulse signal output from the voltage shifter circuit according to an embodiment of the present invention when the input signal shown in FIG. 6 is input.

FIG. 6 shows a voltage shift process performed by the voltage shifter circuit of the present invention, when a modulated pulse signal with a high voltage of 1.2V is input, the first voltage is high (3.3V) and the frequency is low (500 MHZ). FIG. 7 shows a modulated pulse signal output from the voltage shifter circuit according to an embodiment of the present invention when the input signal shown in FIG. 6 is input. The calculated duty cycle of the input signal is 50.5% and the duty cycle of the modulated pulse signal output from the voltage shifter circuit is 50.35%. The difference between the duty cycles is 7% and is very small.

Additional advantages and modifications will readily occur to those skilled in the art. Therefore, the invention in its broader aspects is not limited to the specific details and representative embodiments shown and described herein. Accordingly, various modifications and variations may be made without departing from the scope of the invention as defined by the appended claims and their equivalents.

What is claimed is:

1. A voltage shifter circuit, comprising:
   a pull-up circuit, connected to a first voltage source;
   a pull-down circuit, connected between the pull-up circuit and a ground terminal and connected to an input signal source, adapted to make the voltage shifter circuit output a modulated pulse signal having a high voltage of a first voltage and a low voltage of zero with an operation together with the pull-down circuit;
   a node, at which the pull-up circuit and the pull-down circuit are connected;
   a control circuit, comprising:
   a second inverter, one input terminal of which is connected to the node and the other input terminal is connected to the first voltage source, adapted to invert a node voltage and output an inverted node voltage as an output signal of the voltage shifter circuit;
   a first delayer, connected to the second inverter, adapted to delay the inverted node voltage; and
   a control sub-circuit in the pull-up circuit, a first input terminal of which is connected to the first delayer, a second input terminal of which is connected to the first voltage source, a third input terminal of which is connected to the inverted input signal and an output terminal of which is connected to the pull-up circuit, adapted to turn off the pull-up circuit when the input signal source changes to a high voltage from a low voltage.

2. The voltage shifter circuit according to claim 1, further comprising:
   a first PMOS transistor, a source of which is connected to the first voltage source, a drain of which is connected to the pull-up circuit and a gate of which is connected to the node, adapted to keep the voltage at the output terminal of the control sub-circuit in the pull-up circuit; and
   a second PMOS transistor, a source of which is connected to the first voltage source, a drain of which is connected to the node and a gate of which is connected to the output terminal of the voltage shifter circuit, adapted to keep the voltage at the node.

3. The voltage shifter circuit according to claim 1, wherein, the control sub-circuit in the pull-up circuit further comprises:
   a first NMOS transistor, a source of which is connected to the ground terminal and a gate of which is connected to the input signal source via a first inverter;
   a second NMOS transistor, a source of which is connected to the drain of the first NMOS transistor and a gate of which is connected to the input signal source via the first inverter;
   a third NMOS transistor, a source of which is connected to the drain of the second NMOS transistor and a gate of which is connected to the first delayer, bulk electrodes of the first, second and third NMOS transistors being connected to the ground terminal;
   a third PMOS transistor, a drain of which is connected to the drain of the third NMOS transistor and is lead out as the output terminal of the control sub-circuit in the pull-up circuit, a source of which is connected to the first voltage source, and a gate of which is connected to the first delayer.

4. The voltage shifter circuit according to claim 3, wherein, a threshold voltage of the second NMOS transistor of the control sub-circuit in the pull-up circuit is less than zero.

5. The voltage shifter circuit according to claim 1, wherein, the pull-down circuit is connected to the input signal source through a third inverter, a second delayer and a first inverter; the first inverter is adapted to invert the voltage of the signal from the input signal source; the second delayer is adapted to delay the inverted signal; and the third inverter is adapted to invert the voltage of the delayed and inverted signal.

6. The voltage shifter circuit according to claim 1, wherein, the pull-down circuit comprises:
   a first pull-down NMOS transistor, a source of which is grounded and a gate of which is connected to the input signal source through a third inverter, a second delayer and a first inverter in sequence;

a second pull-down NMOS transistor, a source of which is connected to the drain of the first pull-down NMOS transistor, a drain of which is connected to the node and a gate of which is connected to the input signal source through the third inverter, the second delayer and the first inverter in sequence, bulk electrodes of the first pull-down NMOS transistor and the second pull-down NMOS transistor being connected to the ground terminal.

7. The voltage shifter circuit according to claim 6, wherein, the threshold voltage of the second pull-down NMOS transistor is less than zero.

8. The voltage shifter circuit according to claim 1, wherein, the pull-up circuit comprises:

a first pull-up PMOS transistor, a drain of which is connected to the node, a bulk electrode of which is connected to the first voltage source, and a gate of which is connected to the input signal source through a third inverter, a second delayer and a first inverter in sequence; and a second pull-up PMOS transistor, a drain of which is connected to the source of the first pull-up PMOS transistor, a source of which is connected to the first voltage source, a bulk electrode of which is connected to the source and a gate of which is connected to the output terminal of the control sub-circuit in the pull-up circuit.

9. The voltage shifter circuit according to claim 1, wherein, the delay time of the first delayer is less than 200 ps.

10. The voltage shifter circuit according to claim 1, wherein, the delay time of a second delayer is less than 200 ps.

11. The voltage shifter circuit according to claim 1, wherein, the first voltage is the operation voltage for an I/O circuit region.

12. The voltage shifter circuit according to claim 1, wherein, a high voltage of the signal from the input signal source is the operation voltage for a core circuit region.

* * * * *